United States Patent [19]
Bair et al.

[11] Patent Number: 5,898,595
[45] Date of Patent: Apr. 27, 1999

[54] AUTOMATED GENERATION OF MEGACELLS IN AN INTEGRATED CIRCUIT DESIGN SYSTEM

[75] Inventors: Owen S. Bair, Saratoga; Matthew R. Carbonara, Santa Clara, both of Calif.

[73] Assignee: LSI Logic Corporation, Milpitas, Calif.

[21] Appl. No.: 08/451,177

[22] Filed: May 26, 1995

[51] Int. Cl.$^6$ .................................................. G06F 17/50
[52] U.S. Cl. ........................... 364/491; 364/490; 364/489
[58] Field of Search ................... 395/500; 364/488–491, 364/578

[56] References Cited

U.S. PATENT DOCUMENTS

| | | | |
|---|---|---|---|
| 4,882,690 | 11/1989 | Shinsha et al. | 364/490 |
| 4,918,614 | 4/1990 | Modarres et al. | 364/490 |
| 4,967,367 | 10/1990 | Piednoir | 364/489 |
| 5,031,111 | 7/1991 | Chao et al. | 364/491 |
| 5,084,824 | 1/1992 | Lam et al. | 364/490 |
| 5,095,454 | 3/1992 | Huang | 364/578 |
| 5,168,455 | 12/1992 | Hooper | 364/490 |
| 5,175,696 | 12/1992 | Hooper et al. | 364/489 |
| 5,191,541 | 3/1993 | Landman et al. | 364/489 |
| 5,197,015 | 3/1993 | Hartoog et al. | 364/490 |
| 5,197,016 | 3/1993 | Sugimoto et al. | 364/490 |
| 5,208,764 | 5/1993 | Rusu et al. | 364/491 |
| 5,212,650 | 5/1993 | Hooper et al. | 364/489 |
| 5,218,551 | 6/1993 | Agrawal et al. | 364/491 |
| 5,220,512 | 6/1993 | Watkins et al. | 364/489 |
| 5,301,318 | 4/1994 | Mittal | 395/600 |
| 5,305,229 | 4/1994 | Dhar | 364/489 |
| 5,311,443 | 5/1994 | Crain et al. | 364/491 |

(List continued on next page.)

OTHER PUBLICATIONS

Steptoe, Kevin. "Convergent layout optimization for deep submicron designs," *Electronic Engineering* (May 1995), pp. 41, 42, 44, 46.

Sait et al. ("Design of a cell library for formal high level synthesis", IEEE, Proceedings of the 7th Mediterranean Electrotechnical Conference, Apr. 12, 1994, vol. 3, pp. 1238–1241).

Lin et al. ("Delay and area optimization in standard–cell design", IEEE, 27th ACM/IEEE Design Automation Conference, Jun. 24, 1990, pp. 349–352).

Bride ("Library Development Techniques Speed Chip Design", Electronic Design, vol. 41, No. 21, Oct. 14, 1993, pp. 84, 86).

Weiss ("Probing the Limits of Logic Synthesis", EDN Electrical Design News, vol. 39, No. 6, Mar. 17, 1994, pp. 50–52, 55–56, 59–60, 62).

Anshumali ("ACC: automatic cell characterization", IEEE Comput. Soc. Press, Euro ASIC '91, May 27, 1991, pp. 204–209).

(List continued on next page.)

*Primary Examiner*—Kevin Teska
*Assistant Examiner*—Phallaka Kik

[57] ABSTRACT

A computer-based system and method automate the generation of megacells in the design and layout of integrated circuits. The preferred method utilizes an automatic design generator having a user interface which receives design requirements for a megacell or other complex integrated circuit design. A megacell processor receives the design requirements for the megacell and retrieves relevant megacell implementations from a megacell library. Stored megacell benchmarks are then retrieved from a megacell benchmark memory and applied to corresponding megacells to determine which of the various implementations optimally satisfies the user design requirements. Once the optimal megacell implementation is selected, the megacell processor produces a logic design consisting of a net list and a physical design consisting of design directives which are then used to place and route the megacell as a finished layout. Once the layout is completed, the finished layout is simulated and tested and test results from the finished layout simulation are then fed back to the automatic design generator where the megacell benchmark memory is updated.

16 Claims, 9 Drawing Sheets

U.S. PATENT DOCUMENTS

| | | |
|---|---|---|
| 5,333,032 | 7/1994 | Matsumoto et al. .................... 364/489 |
| 5,345,393 | 9/1994 | Ueda ....................................... 364/489 |
| 5,349,542 | 9/1994 | Brasen et al. ............................ 364/578 |
| 5,459,673 | 10/1995 | Carmean et al. ........................ 364/489 |
| 5,521,837 | 5/1996 | Frankle et al. ........................... 364/491 |
| 5,555,201 | 9/1996 | Dangelo et al. ......................... 364/489 |
| 5,555,210 | 9/1996 | Dangelo et al. ......................... 364/489 |
| 5,633,805 | 5/1997 | Simonsen ................................ 364/490 |

OTHER PUBLICATIONS

Asdjodi ("ELL: Extendable Library Language", IEEE Comput. Soc. Press, Proceedings of the Twenty–Third Annaual Hawaii International Conference on System Sciences, vol. 2, Jan. 2, 1990, pp. 257–266).

Cirit ("Characterizing a VLSI standard cell library", IEEE, Proceedings of the IEEE 1991 Custom Integrated Circuits Conference, May 12, 1991, pp. 25.7.1–25.7.4).

Dutt ("Legend: a language for generic component library description", IEEE Comput. Soc. Press, 1990 International Conference on Computer Languages, Mar. 12, 1990, pp. 198–207).

Foo et al. ("Databases and cell–selections algorithms for VLSI cell libraries", IEEE Comput. Soc., vol. 23, No. 2, Feb. 1990, pp. 18–30).

Herbert ("An integrated design and characterization environments for the development of a standard cell library", IEEE, Proceedings of the IEEE 1991 Custom Integrated Circuits Conference, May 12, 1991, pp. 25.6/1–5).

Jha et al. ("Rapid technology projection for high–level synthesis", IEEE Comput. Soc. Press, Proceedings of the Seventh International Conference on VLSI Design, Jan. 5, 1994, pp. 155–158).

Menkis ("Designing for change with a module generator", ESD:The Electronic System Design Magazine, Jun. 1, 1989, pp. 69–72).

Veselinovic et al. ("A flexible topology selection program as part of an analog synthesis system", IEEE Comput. Soc. Press, Proceedings of the European Design and Test Conference, Mar. 6, 1995, pp. 119–123).

Rehani et al. ("A framework for building cell libraries with novel devices", IEEE, vol. 1, pp. 432–436, Jan. 1, 1994).

Rao ("An open environment for standard cell and gate array library development", IEEE Comput. Soc. Press, Proceedings of EURO ASIC '92, Jun. 1, 1992, pp. 72–77).

Nguyen ("Verilog library development using Cadence Central Delay Calculator", IEEE Comput. Soc. Press, Proceedings of the 1994 International Verilog HDL Conference, Mar. 14, 1994, pp. 115–119).

Kurosawa et al. ("Automation of user–specific ASIC library development", IEEE, Proceedings of the Fourth Annual IEEE International ASIC Conference and Exhibit, Sep. 23, 1991, pp. P14–7/1–5).

Neubert et al. ("Top–down knowledge acquisition", IEEE Comput. Soc. Press, Proceedings of the Second International Conference on Expert Systems for Development, Mar. 28, 1994, pp. 108–113).

Katsadas et al. ("Regular module generation or standard cells: two alternative implementations of a library of functional building blocks", IFIP Transactions A (Computer Science and Technology), Jan. 1, 1993, pp. 167–181).

Dutt et al. ("Bridging high–level synthesis to RTL technology libraries", Proceedings of the 28th ACM/IEEE Design Automation Conference, Jun. 17, 1991, pp. 526–529).

Roa et al. ("On clustering for maximal regularity extraction", IEEE Transactions on Computer–Aided Design of Integrated Circuits and Systems, vol. 12, No. 8, Aug. 1993, pp. 1198–1208).

Royals et al. ("Creating the IC palette (ASIC design)", IEEE Comput. Soc., First international Workshop on Rapid System Prototyping: Shortening the Path from Specification to Prototype, Jun. 4, 1990, pp. 76–86).

| MEGACELL | LIBRARY |
|---|---|
| ALU<br><br>(ALU1, ALU2, ALU3 ....) | ALU Templates<br>(Template 1, Template 2, Template 3 ....) |
|  | ALU Rules<br>(Rules 1, Rules 2, Rules 3 ....) |
| Multiplexer | Mux Templates |
|  | Mux Rule |
| Multiplier | Multiplier Templates |
|  | Multiplier Rules |
| ⋮ | ⋮ |
| Default | Default Templates |
|  | Default Rules |

AUTOMATED GENERATION OF MEGACELLS IN AN INTEGRATED CIRCUIT DESIGN SYSTEM

BACKGROUND OF THE INVENTION

1. Field of the Invention

This invention relates to computer software and systems used in the design of electronic components and more particularly to the automatic generation of megacells in a computer system used in the design and layout of integrated circuits.

2. Description of the Background Art

Figure 1:
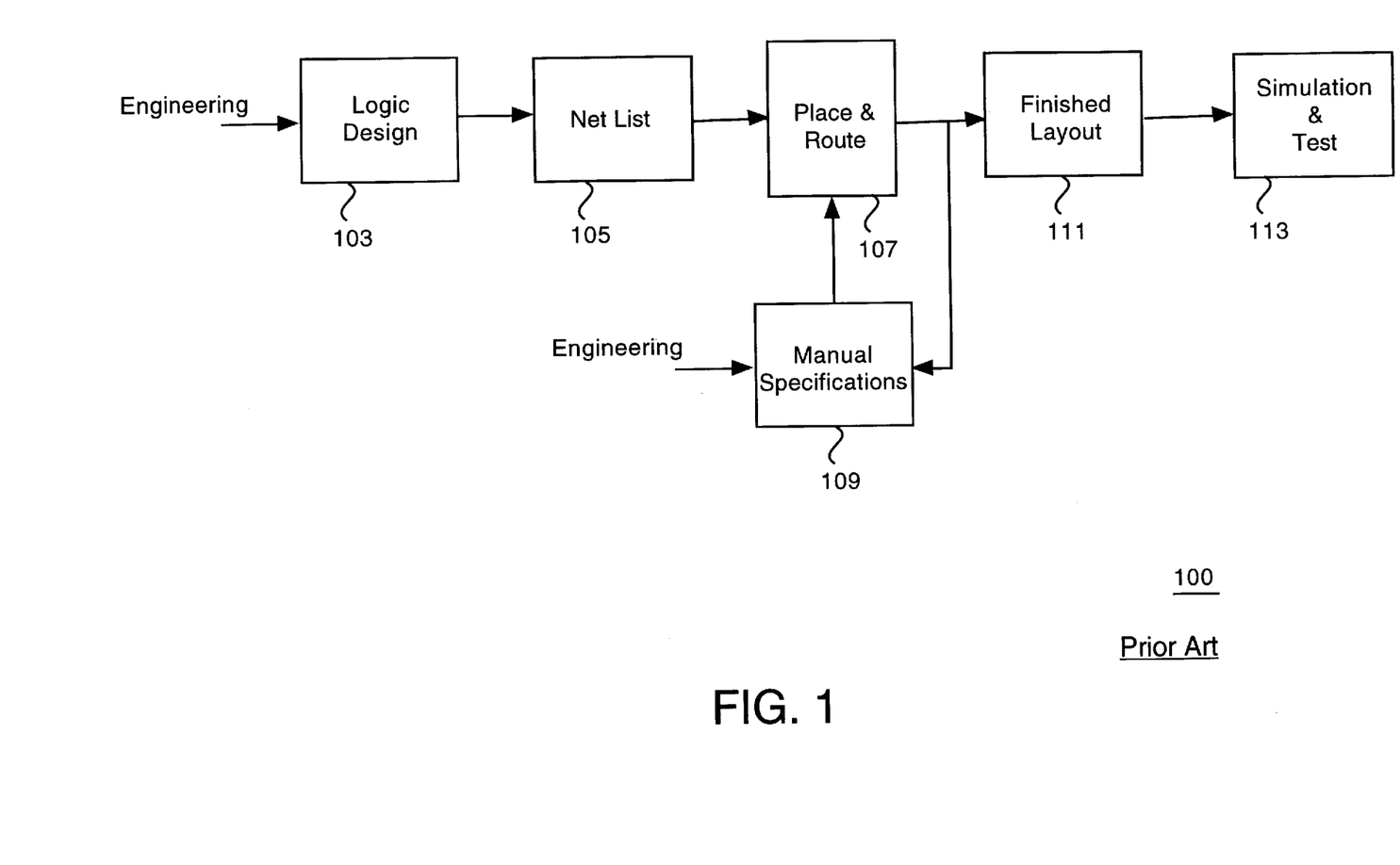
FIG. 1 is a block diagram showing an overview of the prior art process used in the design and layout of integrated circuits.

Referring now to FIG. 1, a block diagram is shown illustrating a conventional IC design system 100 typically used in the design and layout of integrated circuits. Logic designs 103 are conventionally entered into the system 100 in the form of graphical schematic diagrams or as systems of Boolean equations. Other forms of logic design 103 entry include VHDL (VHSIC Hardware Description Language) descriptions and RTL (Register Transfer Language) descriptor sequences. Once the logic designs 103 are entered into the system, a net list 105 is conventionally produced using ECAD (Electronic Computer Aided Design) net list extraction tools such as Schematic Compiler, which generates net lists from schematics. Schematic Compiler is a component of Concurrent Modular Design Environment (C-MDE™), manufactured by LSI Logic Corporation of Milpitas, Calif. A computer net list 105 consists of a listing of circuit devices such as transistors followed by sequences of attributes which include node numbers, electrical parameters, and physical device sizes. A variety of conventional net list formats are commonly used and understood by those skilled in the art. Once the net list 105 is generated, the electronic circuit design is converted to a physical layout design using a conventional place and route 107 computer program such as Block Compiler. Block Compiler is a component software utility of C-MDE which attempts to place and route the given net list within area constraints defined by the user. Conventional placement and routing, at best, is generally a semi-automatic process, where the design engineers enter specific layout constraints and make adjustments to the physical design as the process proceeds. Once a computer generated placement and routing occurs the physical design is examined and manual specifications are then applied to the placement shown in block 109. The steps of placement and routing 107 and adjustment using manual specifications 109 is iterated until a finished layout is produced in block 111.

The two common design criteria which are used as measures of performance in placement and routing 107 are circuit speed and physical design compactness. Two important goals in circuit design are to design circuits that operate at high speed and to produce circuits that require a minimum amount of electrical floor space. Greater circuit speeds enable the circuits to operate faster and thereby produce more functionality per unit time. Improved compactness enables savings in a variety of areas including manufacturing costs, power dissipation, and yield of parts manufactured. Since circuit devices which are packed more closely together tend to suffer less from transmission delay at high frequency, it is generally accepted that more compact circuits tend to run faster and more reliably.

Design intervention is required with manual specifications at block 109 in order to achieve optimal speed and compactness in the routing process. When low complexity circuit designs are involved, automated placement and routing systems 107 tend to do a reasonably good job of providing acceptable design performance. However, as the logic designs become more complex, manual intervention in the form of manual specifications 109 are more frequently required.

Design intervention is very time consuming and requires circuit designers who are highly knowledgeable both in circuit design and in the placement and routing of integrated circuits. Particularly as integrated circuits become more complex and run at higher operating speeds, the requirement for high levels of design skill on the part of the circuit designer will only increase. It has long been a goal of ECAD system design to enable less skilled integrated circuit designers to produce finished layouts while focusing attention on the logic design and not on the placement and routing required to produce the finished layout 111.

What is needed is an electrical computer aided design system which enables manual specifications to be inserted at the logic design stage in a way that the iterative requirement to intervene in the place and route process is eliminated.

SUMMARY OF THE INVENTION

In accordance with the present invention, a computer-based system and method are disclosed for automating the generation of megacells in the design and layout of integrated circuits. The preferred method of the present invention utilizes an automatic design generator having a user interface which receives design requirements for a megacell or other complex integrated circuit design. A megacell processor receives the design requirements for the megacell and retrieves relevant megacell implementations from a megacell library. Stored megacell benchmarks are then retrieved from a megacell benchmark memory and applied to corresponding megacells to determine which of the various implementations optimally satisfies the user design requirements. Once the optimal megacell implementation is selected, the megacell processor produces a logic design consisting of a net list and a physical design consisting of design directives which are then used to place and route the megacell as a finished layout. Once the layout is completed, the finished layout is simulated and tested and test results from the finished layout simulation are then fed back to the automatic design generator where the megacell benchmark memory is updated. Updating the megacell benchmark library with layout simulation data enables the system to operate with a feedback loop, resulting in increasingly improved performance with each cell placement and routing. Each time a megacell implementation is used, additional benchmark data is collected and stored for the implementation. As variations on specific megacell implementations are requested by the user, benchmarks for different implementations are added and the overall usefulness of the system improves.

The megacell library further contains a default megacell enabling users and megacell developers to create new megacell library entries. The user selects and edits the default megacell from the megacell library when a new megacell implementation is desired. The megacell processor produces the logic and physical designs for this new megacell, and the megacell is placed and routed to produce a finished layout. Simulation and test measurements are collected on the finished layout and transmitted back to update the megacell benchmark files associated with the new megacell implementation. Using this route-and-test feedback loop, the megacell library can be optimized to produce components having desired performance characteristics.

The preferred embodiment of the automatic design system comprises a CPU coupled to a variety of memory storage devices in a conventional von Neuman architecture. The system is preferably implemented on a conventional microprocessor-based general purpose computer running specific application software to implement the methods of the present invention.

DESCRIPTION OF THE PREFERRED EMBODIMENT

Figure 2:
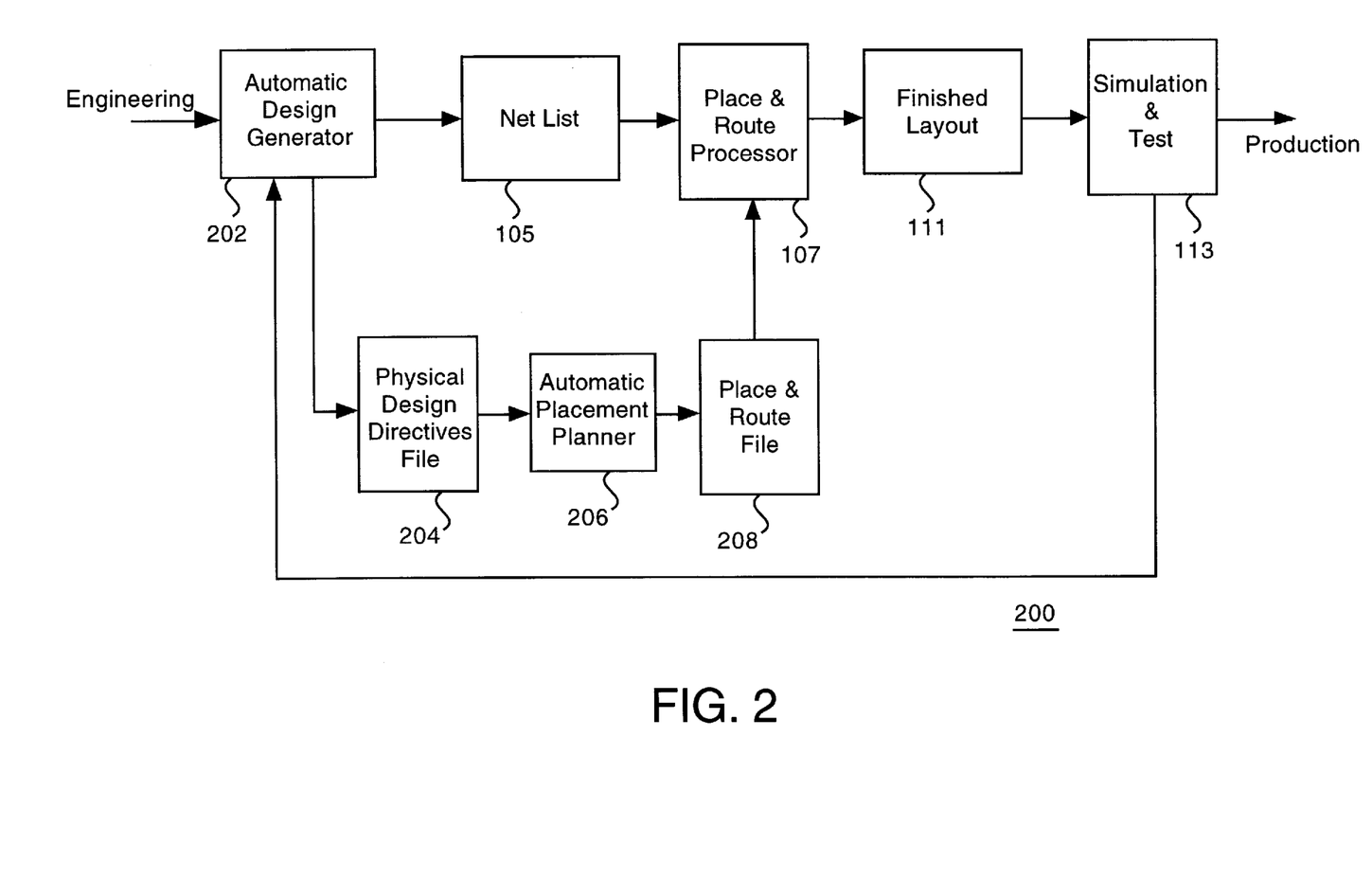
FIG. 2 is a block diagram showing an overview of the process used in accordance with the present invention for the design and layout of integrated circuits, in which an electrical and physical design are separately produced by an automatic design generator.

Referring now to FIG. 2 a block diagram is shown illustrating an overview of the automated design system 200 used in accordance with the present invention in the design and layout of integrated circuits. Integrated circuit design requirements are entered by a design engineer into the automatic design system 200 using a computer interface contained within automatic design generator 202. The preferred automatic design system 200 of the present invention is particularly well suited for the design and implementation of megacells. A megacell is conventionally defined as a single, large cell or a collection of smaller cells which implement a specific function. Generally speaking, an integrated circuit cell is a collection of several to several hundred transistors which implements a specific logical or electrical function. Examples of common cells used in the design and implementation of integrated circuits include AND gates, OR gates, simple adders, and shift registers. Use of integrated circuit cells is common in integrated circuit design, since the cells can be designed and optimized for speed and size, and then used repetitively in a larger circuit design. Megacells comprise a large number of transistor devices, often more than 50,000, to produce cells of significant complexity. The megacells often contain systems of other cells which are connected together to produce a more sophisticated function. Although the system of the present invention is especially well suited for automated megacell design, the system 200 is also useful in the design of smaller or larger integrated systems. Indeed, the term megacell is broadly defined herein, and should be read to include any system comprised of circuit integration.

The automatic design generator 202 receives the instructions from the circuit designer in the form of entries made through a user interface. The user interface to the automatic design generator 202 is conventional and enables a variety of different user interactions. Once the automatic design generator 202 receives the user input, a net list 105 is produced which defines the connectivity of the various electrical devices comprising the integrated circuit design. In addition to producing a net list 105, the automatic design generator 202 also generates an output file of physical design directives 204. The physical design directives file 204 comprises a file containing a library of structures and rules which relate to the physical layout of the megacell being generated by the automatic design generator 202. These physical design directives 204 are then used in an automatic placement planner 206 to generate a place and route file 208. A conventional place and route processor 107 combines the place and route file 208 with the net list 105 to generate the physical interconnecting geometries which are used to produce a finished layout 111. This finished layout 111 enables the production of a set of wafer masks which are then in turn used to produce semiconductor wafers in a semiconductor manufacturing process. A useful aspect of the present invention is that the finished layout 111 is simulated in simulation and test block 113, and test results are then transferred back to the automatic design generator 202 to provide feedback to the generation of the physical design directives 204 and the net list 105. By sending test results back to the automatic design generator 202, optimization of the finished layout 111 can be performed by making changes at the automatic design generator 202.

Figure 3A:
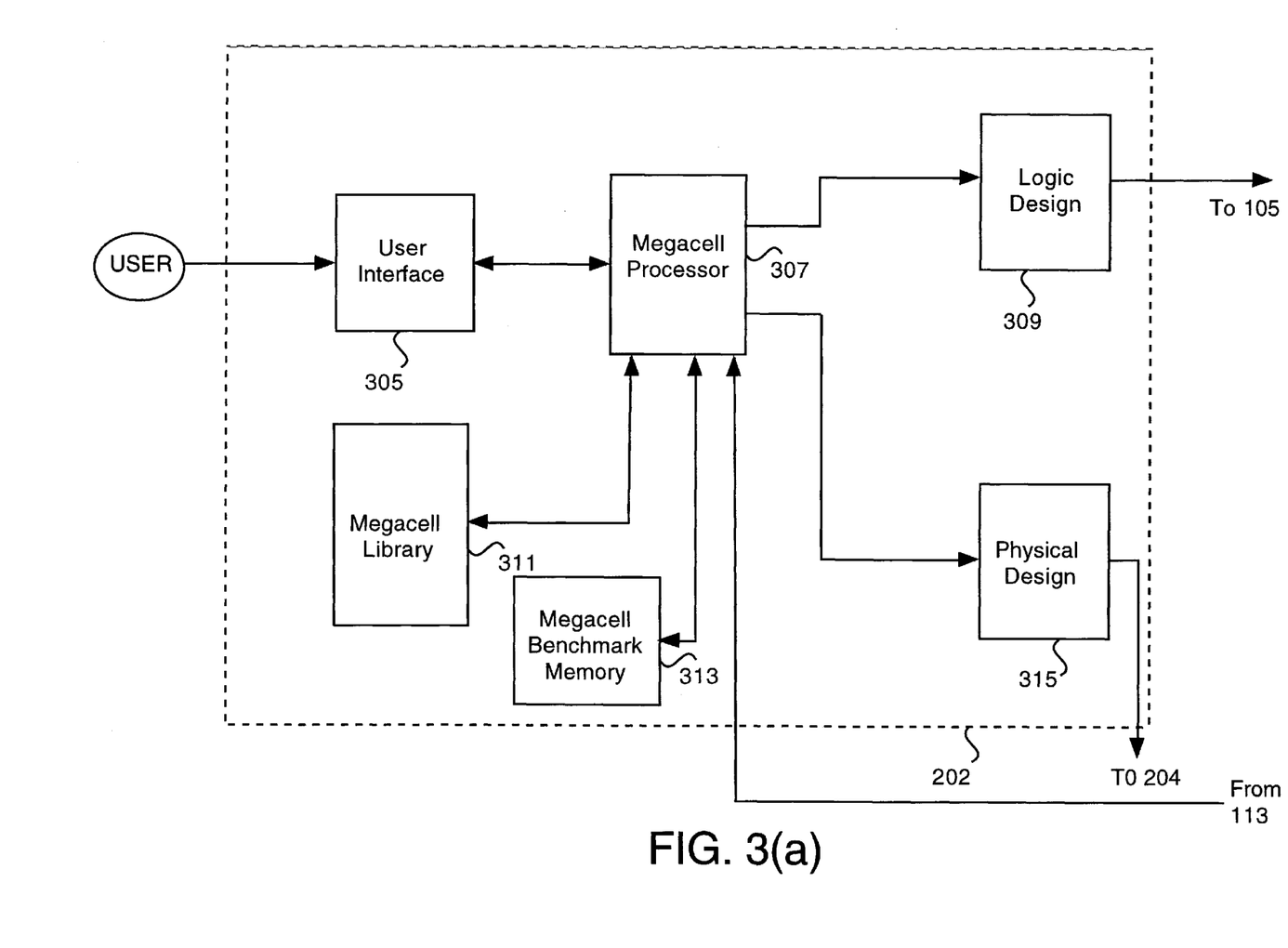
FIG. 3(a) illustrates in block diagram form, the detail architecture of the automatic design generator of FIG. 2.

Referring now to FIG. 3(a), a block diagram is shown illustrating a more detailed architecture of the automatic design generator 202 introduced in FIG. 2. The user interface 305 receives instructions from a design engineer (user) relating to specific requirements of the integrated circuit being designed in system 200. User interface 305 is conventional, and is exemplified by Logic Block Synthesis (LBS). Logic Block Synthesis is a software application component of the C-MDE product manufactured by LSI Logic Corporation. The LBS utility is also available as a software component of LSI Toolkit, also available from LSI Logic Corporation.

In the preferred embodiment, the user interface 305 provides the user a menu of choices, listing the types of circuits and cells that are available for implementation. The user interface 305 also queries the user as to specific requirements that may be important in the circuit design. These special requirements may include parameters relating to circuit compactness or to circuit speed. There may be specific timing issues that are of critical importance in the circuit design that the user interface 305 will receive from the user. If the megacell being produced, for instance, is a multiplexer, an important design consideration is the number of input lines and output lines that will be used in the multiplexing function. If the megacell being considered is a 4-bit adder, other considerations that might be important include the handling of the carry bit, the pin-out orientation of the least significant and most significant bits, and the specific addition algorithm used in implementing the megacell. Another important parameter that may be received by the user interface 305 is the aspect ratio, that is the geometrical ratio of the width and length which the finished megacell layout will assume. In the preferred embodiment, the user interface 305 is a sophisticated expert system, implemented as a software application on the CPU of a general purpose computer (discussed below with reference to FIG. 6). The user of the interface 305 is guided through a description of the megacell design with a fairly straightforward series of questions. Other inputs which may be alternatively supplied to the user interface 305 include VHDL, Verilog and RTL high level description language sequences, which are then translated by the user interface for use by the rest of the system 200. One inquiry made by the user interface of the user is whether the user prefers a place and route determination based on data path criteria, or instead based on traditional ASIC minimization techniques (discussed below with reference to FIG. 5). This place and route preference is propagated by the automatic design generator 202 to the automatic placement planner 206, and used in preparing the place and route file 208.

Megacell cell processor 307 is preferably a software process which works in cooperation with user interface 305 to receive user design requirements and to compare those design requirements to various megacell implementations which are stored in megacell library 311. In addition, the megacell processor reads a series of megacell benchmarks which are stored in a megacell benchmark memory 313. The stored benchmarks comprise measured performance data relating to the various megacell implementations stored in the megacell library 311. The megacell processor 307 first selects from among the stored megacell implementations in the megacell library 311, the various megacell implementations which match the megacell type specified by the user to the user interface 305. The megacell processor 307 then matches the selected megacells with related benchmark data stored in the megacell benchmark memory 313. The megacell processor 307 then compares the user design requirements benchmark data and selects a specific megacell design which most closely meets the user's design requirements. After selecting a specific megacell design for implementation as a finished layout 111, the megacell processor 307 then generates two outputs. The first output generated by the megacell processor 307 is the logic design 309, which contains electrical net list information defining the connectivity between the various circuit components. The megacell processor 307 also generates a physical design 315 which is a description file defining the physical geometries which connect together to produce the defined megacell selection.

Figure 3B:
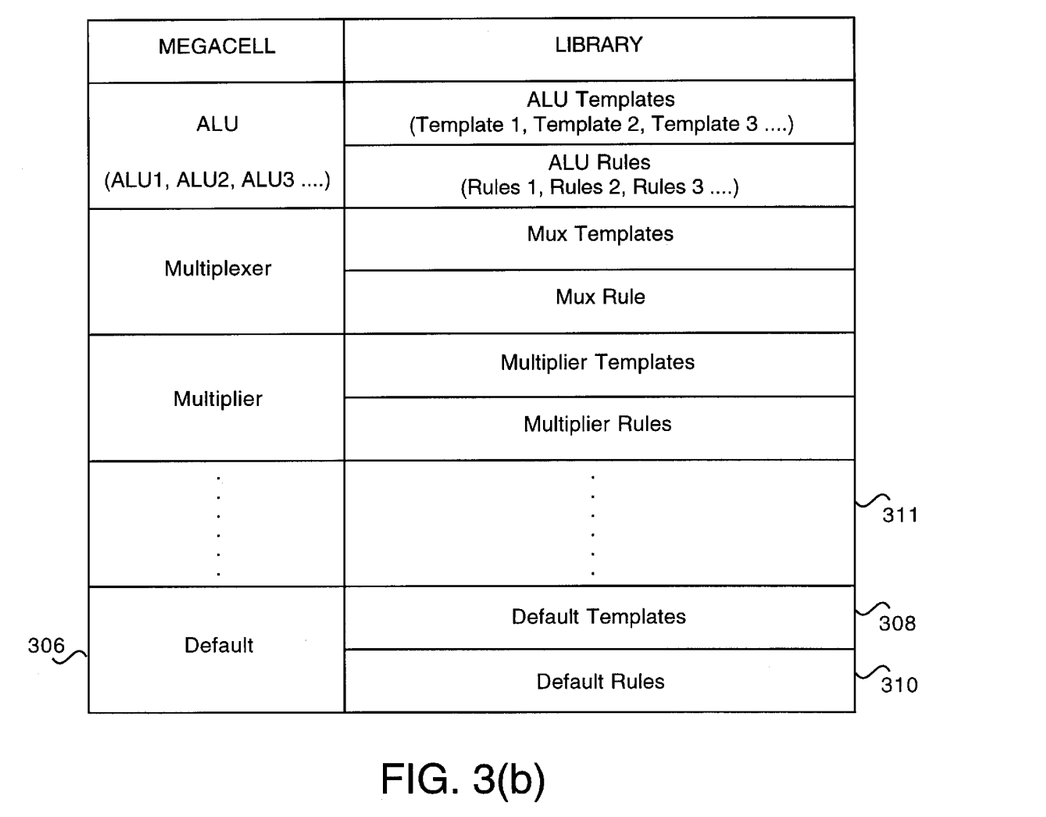
FIG. 3(b) shows the preferred memory structure of the megacell library embodied in the automatic design generator of FIG. 2.

Referring now to FIG. 3(b), a preferred memory structure of the megacell library 311 is shown. The megacell library consists of a sequence of stored megacells represented in FIG. 3(b) by the column labeled "MEGACELL". The stored megacells contained in the megacell library are arranged as a sequence of data files, with each data file consisting of digital information describing the megacell structure and function. For each megacell stored in the megacell library 311, the library 311 preferably contains a collection of megacell templates and a listing of megacell rules. The megacell templates represent the various implementations of the megacells available to the automatic design generator 202. For each of the megacell implementations, the megacell benchmark memory 313 stores a listing of measured physical attributes which define the specific megacell implementation. In FIG. 3(b) the megacells listed include an ALU (arithmetic logic unit), a multiplexer, and a multiplier. As indicated by the vertical ellipse shown at the bottom of the MEGACELL column, these are but a few of the possible megacells which may be implemented and stored in megacell library 311. For the ALU megacell, the library holds a collection of ALU templates (Template 1, Template 2, Template 3 . . . ) and a collection of ALU rules (Rule 1, Rule 2, Rule 3 . . . ). The ALU templates collection contains several implementations of the ALU with variations in physical and electrical attributes. For instance, a first ALU (ALU 1) may be designed for a minimum geometry in a finished layout. The ALU 1 implementation is associated with a stored ALU 1 template file (Template 1) and a stored rules file (Rule 1). Likewise, a second stored ALU may be designed to operate at the fastest possible speed with the fewest total sequential gate delays. A third ALU may be simultaneously optimized for both speed and size. The ALU rules collection (Rule 1, Rule 2, Rule 3 . . . ) contains a listing of requirements which are specific to the ALU. For instance, the ALU shown in FIG. 3(b) may be an 8-bit ALU, and therefore the rules may define a first set of 8-bit inputs, a second set of 8-bit inputs and a single set of 8-bit outputs. Additional rules may specify that the ALU requires a clock signal, a specific number of address bits, and generates a flag bit which indicates an ALU overflow. Other rules which are contained in the ALU rules collection include identification of the specific ALU, rules governing the use of ALU opcodes, and attributes defining the size and accessibility of memory.

At the bottom of the FIG. 3(b) memory map illustrating the megacell library 311, is an entry for a default megacell 306. The purpose of the default megacell 306 is to enable users and megacell developers to create new megacell entries in the megacell library 311. In the preferred embodiment, the user selects from a megacell menu generated by the user interface 305, the specific megacell for which placement is desired. If the user wishes to place and route a megacell which does not appear in the megacell menu generated by the user interface 305, a corresponding megacell implementation may be created using the default megacell 306. The default megacell 306 contains a generic set of default templates 308 and default rules 310 which may be edited by the user through the user interface 305. These default templates 308 and default rules 310 are modified by the user to approximate the requirements of the desired new megacell. Alternatively, editing of the default template 306 may also be effected by copying and modifying templates and rules from an existing megacell implementation to a default megacell 306. Once the default megacell 306 has been edited for implementation of the new megacell, the megacell is routed using the place and route processor 107 to produce a finished layout 111. This finished layout 111 is simulated and tested to produce measured megacell benchmarks which are then stored in benchmark memory 313. Using these test results, the user can then modify the new megacell implementation stored in megacell library 311 in order to optimize specific functional and physical parameters of the megacell implementation.

Figure 3C:
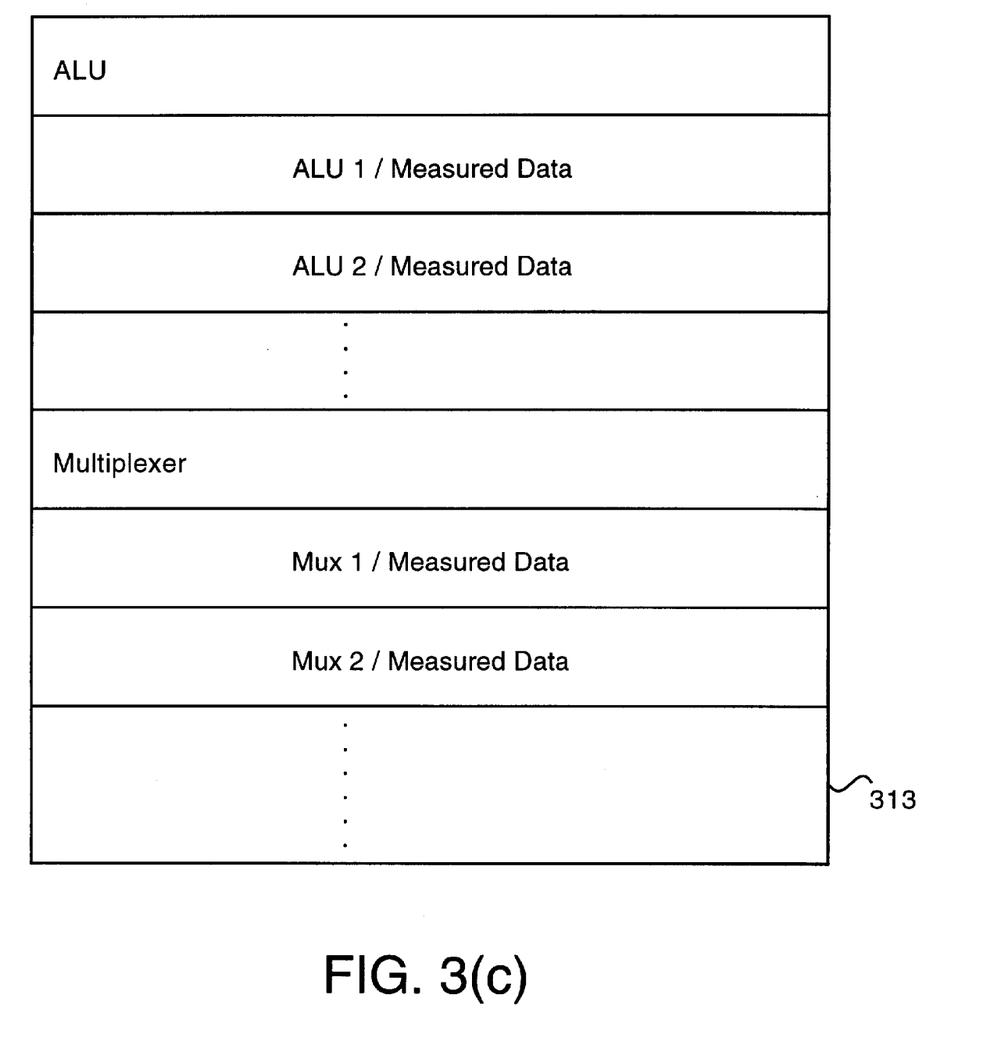
FIG. 3(c) shows the preferred memory structure of the megacell benchmark memory embodied in the automatic design generator of FIG. 2.

Referring now to FIG. 3(c), a preferred memory structure of the megacell benchmark memory 313 is shown. When the megacell processor 307 has selected the various relevant megacell implementations from the megacell library 311, the megacell processor then compares the user requirements from user interface 305 to various performance parameters which have been measured and collected for different megacell implementations. The megacell processor 307 receives test results from simulation and test block 113 as well as from measurements made on actual parts produced by the automated design system 200 of the present invention, and makes a decision about if and how to update the megacell benchmark memory 313. By receiving test results from the simulation test data and also from parts produced from the finished layout 111, the automated design generator 202 can be thought of as an expert system that becomes "smarter" with use. As new megacell benchmark measurements are made and stored in megacell benchmark memory 313, the reliability of those measurements and their usefulness for future designs improves. Furthermore, as new megacells are added to the megacell library 311, new data can be entered into the megacell benchmark memory 313 to improve and expand the overall data base available to the user. Since this feedback from the test and simulation block 113 occurs continuously, the automated design system 200 in many ways acts as a controlled feedback system in which the experience of prior designs can be used to ensure future design reliability. This feedback of test results is particularly valuable as the semiconductor processes used to manufacture the finished layouts 111 are changed.

Two exemplary megacells (an ALU and a multiplexer) are shown in FIG. 3(c) to demonstrate how the megacell benchmark memory 313 stores benchmark files related to the megacell implementations. The ALU is shown containing two implementations of the ALU: ALU 1 and ALU 2. ALU 1 is shown containing measured data related to the implementation of ALU 1. Following the data file containing measured data for ALU 1, is a data file containing measured data for ALU 2. The benchmark memory 313 is designed so that it can continue to expand and grow as additional measured data is collected and added to the megacell benchmark memory 313. Likewise, the multiplexer megacell is shown having two multiplexer implementations: MUX 1 and MUX 2. Each of the multiplexer implementations also contains data files storing measured data.

Figure 3D:
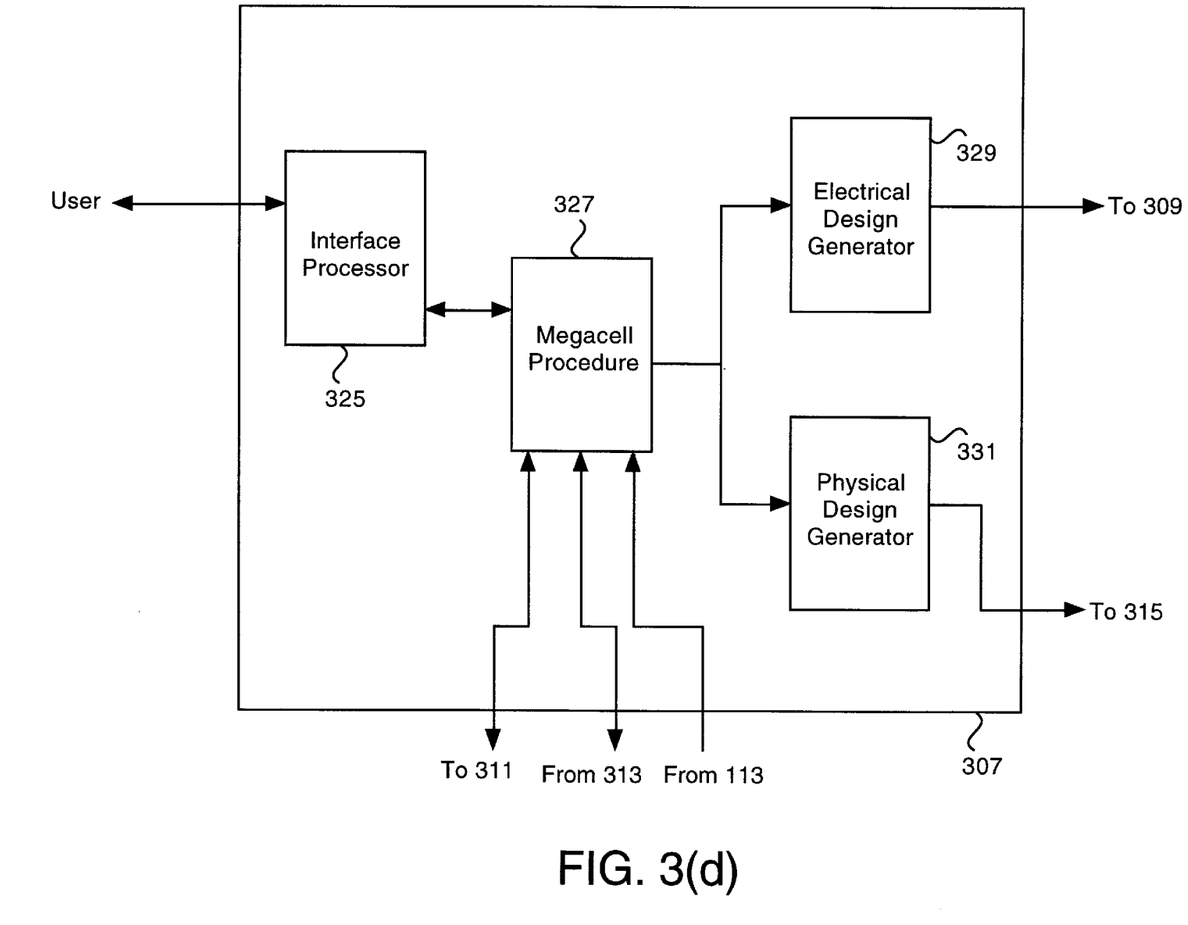
FIG. 3(d) shows the preferred structure of the megacell processor embodied in the automatic design generator of FIG. 2.

Referring now to FIG. 3(d), a detailed diagram is shown of the architecture of megacell processor 307. Megacell processor 307 comprises four major blocks. The first block of the megacell processor 307 is the interface processor 325 which directs and controls the communication between the megacell processor 307 and the user interface 305. Important functions of the interface processor 325 are to provide the user interface 305 with information relating to the available megacells stored in the megacell library 311, as well as to communicate to the user information relating to the contents of the megacell benchmark memory 313. The interface processor 325 also verifies that all parameters and data fields required by the megacell processor 307, are received by the megacell processor 307 and that they comply with required format and data type requirements. Interface processor 325 is also responsible for generating error messages to the user interface 305 and controlling and directing data flow between the user interface and the megacell processor 307.

The interface processor 325 is further connected to a megacell procedure 327. The megacell procedure 327 is the application program which controls and implements the megacell processor 307. Megacell procedure 327 receives user requirements from the interface processor 325, and from these user requirements identifies megacells stored within megacell library 311 which satisfy the user requirements. The megacell procedure 327 reads available megacell implementations from benchmark memory 313 and from the various implementations determines which, if any, of the available megacell library 311 implementations are appropriate for use in the specified user design. Megacell processor 307 is responsible for updating the megacell benchmark memory 313 and controls the collection of measured test data which is stored in megacell benchmark memory 313. Megacell procedure 327 selects from among the various megacell implementations, the most appropriate implementation as identified by data stored in the megacell benchmark memory 313 and then transmits rules and templates from megacell library 311 to the electrical design generator 329 and the physical design generator 331.

The electrical design rule generator 329 receives the templates and converts these templates to a conventional net list comprising a series of devices with corresponding node connections. The physical design generator 331 receives the templates and rules from the megacell procedure 327 and produces a hierarchical physical design 315 file which defines the physical layout requirements of the selected megacell. The file produced by the physical design generator 331 consists of size and location information for the various devices contained in the selected megacell. The physical design 315 file lists the sizes of each of the transistors required to implement the megacell as well as their general physical locations and design rules relating to their placement.

Electrical design generator 329 transmits the net list information to logic design 309 which formats the net list data into a conventional net list 105 file structure which may be utilized by the place and route processor 107 to produce the finished layout 111. The physical design generator 331 communicates its design file to physical design 315 which then also performs a formatting function to create a file format for use by the place and route processor 107 to produce the finished layout 111.

Figure 4:
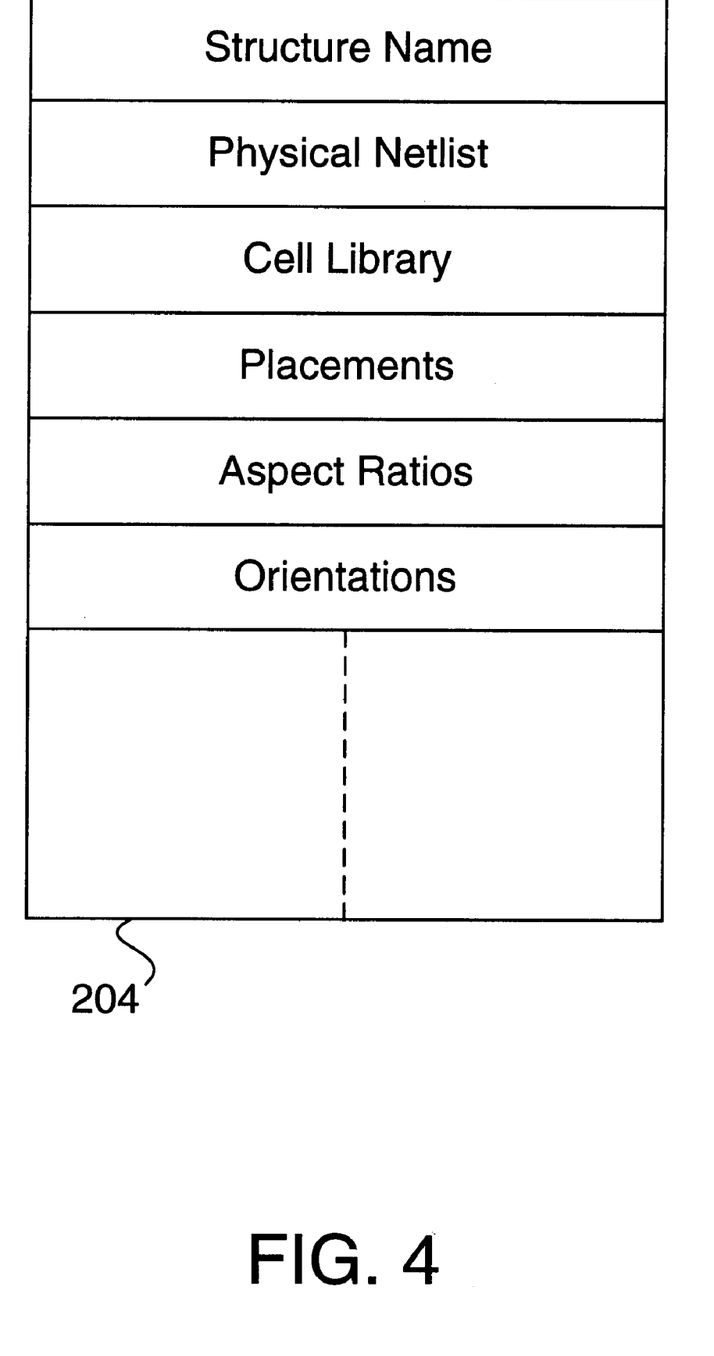
FIG. 4 is an overview memory map showing the organization of the physical design directives embodied in the automatic design generator of FIG. 2.

Referring now to FIG. 4, a memory map is shown identifying the various structures contained in the physical design directives 204 file. The first field contained within the physical design directives 204 is the structure name. This structure name identifies the megacell being transmitted from the automatic design generator 202 for layout by the place and route 107 processor. Following the structure name in the physical design directives 204 map of FIG. 4, is a physical net list which identifies the connectivity between the various components contained in the megacell structure. Below the physical net list in the directives 204 is a cell library containing a library of cell structures which are used within the megacell to build the megacell circuit. Structures contained within the cell library include various commonly used cells such as AND gates, OR gates, exclusive-OR gates, and the like. Use of cell library structures enables significant savings in file size and processing time, since the physical net list now can be stored as a system of interconnected cells rather than as a much larger listing of interconnected transistors. Following the cell library entry in FIG. 4 is a listing of cell placements. These placements identify the general location of each of the cells contained within the megacell. The placement of cells is largely constrained by directives which are stored as templates in the megacell library 311. Information relating to the performance of these placed cells is benchmarked and stored in megacell benchmark memory 313. By pre-defining the placement of cells, the work of the place and route 107 process is greatly simplified. An important advantage enabled by the physical design directives 204 is the elimination of the need for manual specifications 109 (FIG. 1). By generating physical directives in the automatic design generator 202, iterative manual adjustment during the place and route 107 step is no longer required. This improvement greatly simplifies the design process and makes the generation of finished layouts 111 available to circuit designers who are less expert in the IC layout.

In addition to cell placements, the aspect ratios of the various cells are also identified in the physical design directives 204 file. Aspect ratios define the width of the cell as a function of the length of the cell and determine to a large degree what kind of placements will be available within the megacell. For instance, a cell which has a wide data bus but very few gate delays might require a wide cell dimension with a very short cell length. On the other hand, a cell such as a 4-bit ADDER may be able to be implemented using a footprint having similar width and length dimensions. In addition to cell placement and aspect ratios of each of the cells, an important parameter which must be defined for each cell that is stored in the library of structures is the orientation of the cell. Orientation defines geometrical input/output attributes of the cell. Orientation, for instance, defines whether data enters the cell from the left or the right, and whether the outputs are directed up or down. Proper cell orientation is important in minimizing the distances which signals must transverse in going from one cell to the next. For short signal paths it is desirable to have the inputs of one cell line up with outputs of the previous cell in the signal flow.

Figure 5:
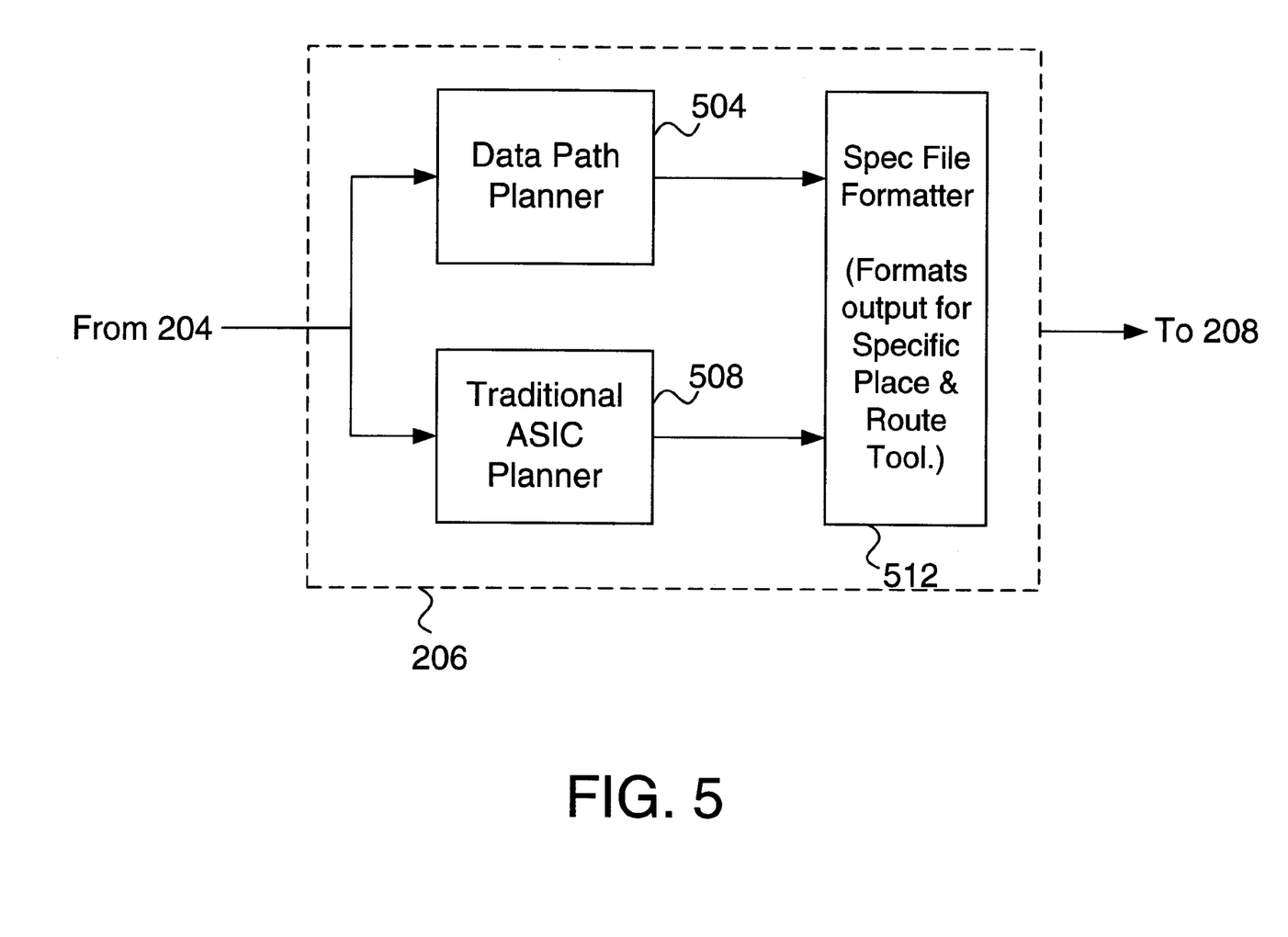
FIG. 5 is a block diagram illustrating the architectural structure of the automatic placement planner embodied in the automatic design generator of FIG. 2.

Referring now to FIG. 5, an architectural block diagram of the automatic placement planner 206 is shown. The physical design directives 204 file is read by the automatic placement planner 206. The automatic placement planner 206 contributes to design flexibility for megacell circuit designers, enabling the circuit designer to choose between a traditional ASIC plan that consists of a hierarchical cell placement or a more route-directed data path plan which considers the details of data path flow. The distinction between data path placement and traditional ASIC placement lies in the priorities considered by the place and route processor 107 in generating a finished layout 111. Data path placement refers to the placement of cells in a regular, systematic format, based on the data flows existing in the design. By routing the cell based on data flows, a faster and more compact design placement often results. In addition to achieving a more optimized design, the process of routing the finished layout 111 is often greatly accelerated when data flow analysis is performed. In a traditional ASIC planner, priority is given to optimizing some specific cost function of the finished layout 111. For instance, one cost function which is commonly optimized is wire length. Wire length optimization attempts to produce the shortest possible interconnect path between circuit gates. Although ASIC-based routing can optimize specific design characteristics, highly irregular placements often result. Also, traditional ASIC routing often requires large amounts of CPU time to generate finished layouts 111.

Automatic placement planner 206 receives the physical design directives file 206 and reads the file to determine whether the file is a data path planner 504 file or a traditional ASIC planner 508 file. Once the planner type is identified, a specification file formatter 512 formats the physical design directives file 204 from the automatic placement planner 206 into a place and route file 208 for direct operation by place and route processor 107. The place and route file 208 is conventional and the specific format of the file produced by formatter 512 is dependent on the choice of computer application program used to implement the place and route processor 107. The specification file formatter 512 acts as a file filter to convert the data path planner 504 or traditional ASIC planner 508 into a place and route file 208 format required by the available place and route processor 107.

The place and route processor 107 reads both the net list 105 and the place and route file 208 and produces a finished layout 111. The place and route processor 107 is conventional and the preferred embodiment for data path routing is represented by a software program called DPPR (Data Path Placer and Router), manufactured by LSI Logic Corporation. The DPPR program is a component of the above-referenced C-MDE package. A program called Block Compiler, also available from LSI Logic Corporation, is the preferred ASIC placement and routing tool used to implement the place and route processor 107. The results of the finished layout 111 are then simulated and tested in block 113. Test results from the simulation and test function 113 are then transmitted back to the automatic design generator 202 for storage and updating of the megacell benchmark memory 313. Following simulation and testing of the integrated circuit, the circuit is then manufactured. These manufactured parts are then further tested and the test results are preferably used to update the megacell benchmark memory 313.

Figure 6:
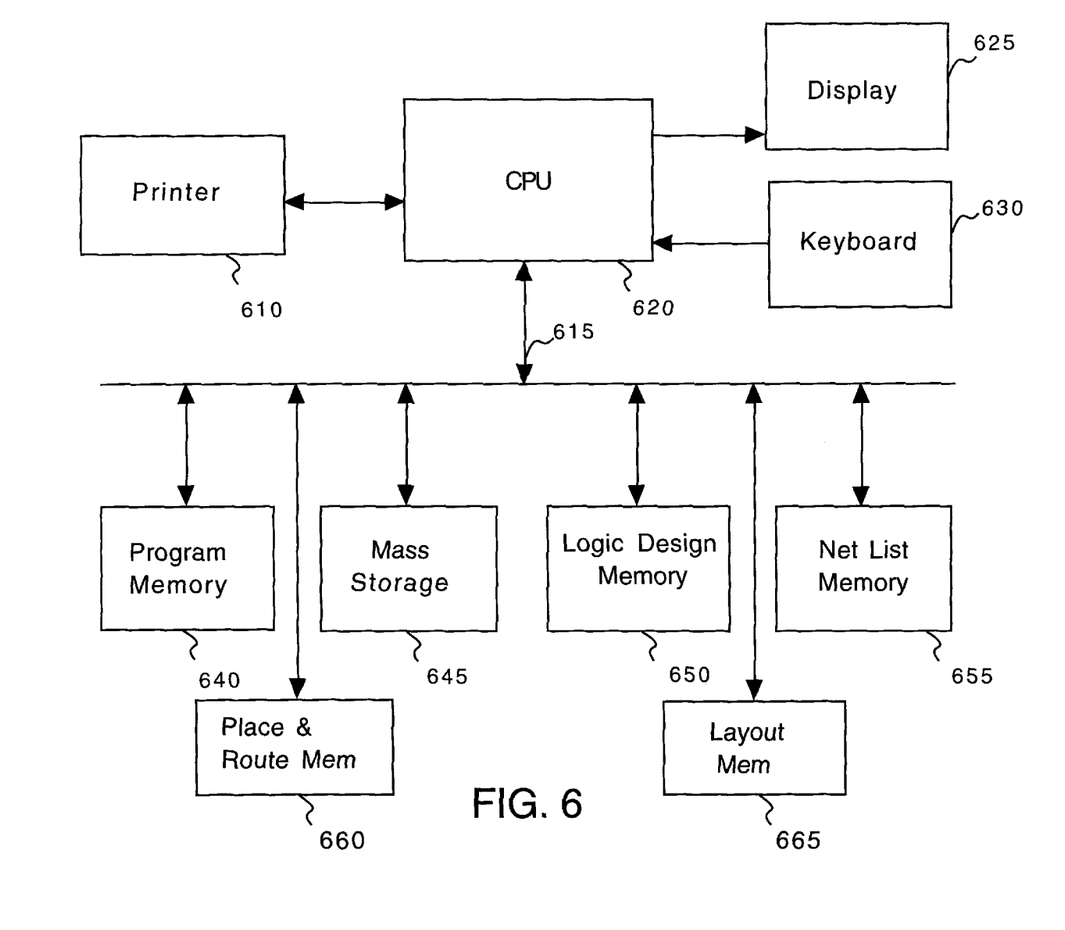
FIG. 6 is a block diagram of the preferred megacell generation and layout tool implemented using a general purpose computer.

Referring now to FIG. 6, a block diagram illustrates an overview of the automated design system 200 constructed in accordance with the present invention, and capable of implementing the preferred method of the present invention. The automated design system 200 includes a display 625, a central processor unit (CPU) 620 and a plurality of memories coupled in a von Neuman architecture via data bus 615, such as is conventionally found in general purpose microprocessor-based computers. The preferred embodiment of system 200 is implemented on a Sun Workstation, manufactured by Sun Microsystems of Mountain View, Calif. The CPU 620 is also coupled to an input device such as a keyboard 630, and optionally to an output device such as a printer 610. The CPU 620 is further coupled through data bus 615 to a program memory 640, a place and route memory 660, mass storage 645, logic design memory 650, layout memory 665 and net list memory 655.

The function of automated design system 200 is to enable an integrated circuit designer to efficiently generate finished layouts 111 using computer processing tools. Program memory 640 contains the computer applications and processes which comprise the automatic design generator 202, the automatic placement planner 206, and the place and route processor 107. Place and route memory 660 contains the place and route file 208. Mass storage 645 comprises the large data files which are used by the program memory 640, including the megacell library 311, the megacell benchmark memory 313 and the physical design directives file 204. Logic design memory 650 stores data and test results related to the simulation and test 113 of the finished layouts 111. The finished layout 111 is stored in the layout memory 665. Net list memory 655 contains the net list 105.

The invention has now been explained with reference to specific embodiments. In light of this disclosure, other embodiments will be apparent to those of ordinary skill in the art. For example, it is within the scope of the present invention to utilize multiple CPU's 620 to implement the automated design system 200, with various system components embodied in separate general purpose computers. Therefore it is not intended that this invention be limited, except as indicated by the appended claims.

What is claimed is:

1. A method for the automated design of megacells in a computer-based design system, comprising the steps of:

receiving design requirements as a high level description language file for a specific megacell;

retrieving stored megacell implementations which relate to the megacell specified by the design requirements;

selecting from among the stored megacell implementations a single megacell implementation, if any, having stored performance specifications which sufficiently and most closely meet the received design requirement;

retrieving a default megacell implementation when no other stored megacell implementation sufficiently meets the received design requirements;

separately generating a net list and a physical design which enable production of a finished layout of the selected megacell implementation;

testing the finished layout of the selected megacell implementation to generate test results; and modifying the stored performance specifications associated with the selected megacell implementation in accordance with the test results.

2. The method according to claim 1 for the automated design of megacells in a computer-based design system, wherein the specific megacell design requirements are received through a computer user interface.

3. The method according to claim 1 for the automated design of megacells in a computer-based design system, wherein the retrieved megacell implementations are of the same megacell type specified by the design requirements.

4. The method according to claim 1 for the automated design of megacells in a computer-based design system, wherein the retrieved megacell implementations comprise megacell templates and rules.

5. The method according to claim 1 for the automated design of megacells in a computer-based design system, the method further comprising the step of editing the default megacell in accordance with said design requirements.

6. The method according to claim 5 for the automated design of megacells in a computer-based design system, the method further comprising the step of generating megacell performance specifications which correspond to the edited default megacell.

7. The method according to claim 6 for the automated design of megacells in a computer-based design system, wherein the performance specifications are generated by testing layouts of the edited default megacell.

8. A computer-aided method for generating a circuit layout in the design of integrated circuits, comprising the steps of:

receiving a set of user-defined parameters as a high level description language file identifying required specifications for the circuit layout, wherein a specific megacell's design requirements are received;

matching the user-defined parameters with circuit implementations stored in a cell library;

applying benchmark data to the matched circuit implementations;

selecting a preferred circuit implementation, if any, from among the matched circuit implementations based on the benchmark data;

retrieving a default megacell implementation when no other stored megacell implementation sufficiently meets the received design requirements;

customizing the selected circuit implementation according to the user-defined parameters;

generating a separate logic design and physical design which define the customized circuit implementation;

generating a finished layout of the circuit implementation utilizing said logic design and said physical design;

testing the finished layout of the selected customized circuit implementation to generate test results; and modifying the benchmark data associated with the selected circuit implementation in accordance with the test results.

9. The method according to claim 8, wherein the user-defined parameters are entered through a menu driven computer interface.

10. The method according to claim 8, wherein the cell library contains a plurality of circuit implementations each circuit implementation comprising at least one set of rules and one set of templates.

11. A system for designing megacell integrated circuit layouts, comprising:

a cell library containing a plurality of available circuit implementations;

a benchmark library containing performance specifications related to the circuit implementations stored in the cell library;

a user interface for receiving user design requirements as a VHDL file;

a processor coupled to the cell library and to the user interface for selecting a preferred circuit implementation, if any, from among the plurality of circuit implementations in the cell library according to the user design requirements received by the user interface;

retrieving a default megacell implementation when no other stored megacell implementation sufficiently meets the received design requirements;

an electrical design generator coupled to the processor for receiving the selected circuit implementation and generating a net list;

a physical design generator coupled to the processor for receiving the selected circuit implementation and generating a set of physical design directives;

a circuit router coupled to the electrical design generator and to the physical design generator for receiving the net list and the physical design directives and for generating a finished layout; and a simulator coupled to the router and to the benchmark library for testing the performance of the finished layout and for transmitting test results to the benchmark library for storage as performance specifications.

12. The system for designing integrated circuit layouts according to claim 11, wherein the cell library comprises rules and templates related to the plurality of available circuit implementations.

13. A system for the automated design of megacells in a computer-based design system, the system comprising:

means for receiving design requirements as a VHDL file for a specific megacell;

means for receiving stored megacell implementations which relate to the megacell specified by the design requirements;

means for selecting from among the stored megacell implementations, if any, a single megacell implementation having stored performance specifications which sufficiently and most closely meet the received design requirement;

means for retrieving a default megacell implementation when no other stored megacell implementation sufficiently meets the received design requirements;

means for separately generating a net list and a physical design which enable production of a finished layout of the selected megacell implementation;

means for testing the finished layout of the selected megacell implementation to generate test results; and means for modifying the stored performance specifications associated with the selected megacell implementation in accordance with the test results.

14. The system according to claim 13, wherein the specific megacell design requirements are received through a computer user interface.

15. The system according to claim 13, wherein the retrieved megacell files are of a type of megacell specified by the design requirements.

16. The system according to claim 13, wherein the retrieved megacell implementations comprise megacell templates and rules.

* * * * *